United States Patent [19]

Ney et al.

[11] 4,412,508

[45] Nov. 1, 1983

[54] NOZZLE BEAM SOURCE FOR VAPOR DEPOSITION

[75] Inventors: Robert J. Ney, St. Petersburg, Fla.; Erich Hafner, Tinton Falls, N.J.

[73] Assignee: The United States of America as represented by the Secretary of the Army, Washington, D.C.

[21] Appl. No.: 407,019

[22] Filed: Aug. 11, 1982

Related U.S. Application Data

[63] Continuation of Ser. No. 216,092, Dec. 15, 1980, abandoned.

[51] Int. Cl.³ .............................................. C23C 13/12
[52] U.S. Cl. .................................. 118/726; 219/274
[58] Field of Search ............... 427/124, 125, 250; 118/725, 726, 727, 719, 733; 159/DIG. 21; 219/274; 122/366

[56] References Cited

U.S. PATENT DOCUMENTS

| | | | |
|---|---|---|---|
| 2,665,225 | 1/1954 | Godley | 118/726 X |
| 3,514,575 | 5/1970 | Hall et al. | 118/726 X |
| 3,690,638 | 9/1972 | Roblin et al. | 118/726 |
| 3,931,493 | 1/1976 | Ferrar | 219/274 |
| 4,125,086 | 11/1978 | Vig et al. | 427/118 X |

OTHER PUBLICATIONS

Morgan, "Crucible for Aluminum Evaporation," IBM Tech. Disclosure Bulletin, vol. 20, No. 7, Dec. 1977, p. 2844.

*Primary Examiner*—John D. Smith
*Assistant Examiner*—Bernard F. Plantz
*Attorney, Agent, or Firm*—Robert P. Gibson; Jeremiah G. Murray; Edward Goldberg

[57] ABSTRACT

A nozzle beam source for use in the vapor deposition of electrode materials such as gold, during the fabrication of precision quartz-crystal resonators, or the like. The nozzle beam source includes a graphite crucible and source tube, a tungsten wick within the source tube, and graphite-to-graphite mechanical seals.

3 Claims, 2 Drawing Figures

NOZZLE BEAM SOURCE FOR VAPOR DEPOSITION

The invention described herein may be manufactured and used by or for the Government for governmental purposes without the payment of any royalties thereon or therefor.

This application is a continuation of application Ser. No. 216,092, filed Dec. 15, 1980, now abandoned.

BACKGROUND OF THE INVENTION

This invention relates to a nozzle beam type metal vapor source for use in the vapor deposition of electrode materials, such as gold, during the fabrication of precision quartz-crystal resonators, or the like.

The nozzle beam source of this invention is an improvement on the nozzle beam source disclosed in U.S. Pat. No. 4,125,086 to John R. Vig et al. dated Nov. 14, 1978, and incorporated herein by reference. The nozzle beam source of the above-noted patent utilized tantalum and tungsten components; however, during the vapor depositing of gold, it has been found that gold rapidly alloys with tantalum thereby preventing the deposition of a high purity electrode material. It was also noted that gold wets hot tungsten surfaces, so that it forms a strong mechanical bond after freezing. Since the thermal expansion of gold is approximately three times that of tungsten, after a few heating cycles the gold exerts considerable hoop stresses on a tungsten container, thereby resulting in a rupture of the required source tube and crucible. It was also noted that the use of tungsten mechanical seals was unsatisfactory since, as noted above, gold wets tungsten, thus, the gold penetrated the seal. It should be understood that other metals such as copper and aluminum present the same problems as gold.

SUMMARY OF THE INVENTION

After considerable research and experimentation, the nozzle beam source of the present invention has been devised wherein the crucible and source tube are made of graphite. Liquid gold does not wet graphite surfaces so that between heating cycles when the gold cools to room temperature, a gap is formed between the gold charge and the walls of the crucible and source tube, whereby, upon reheating the gold to its melting point, the gold expands into the gap without exerting any force on the graphite crucible or source tube.

To prevent the gold from penetrating the seals, they too are made of graphite.

It is clear that the same principle applies to other metals having similar characteristics to that of gold, such as copper and aluminum.

DESCRIPTION OF THE PREFERRED EMBODIMENT

Figure 1:
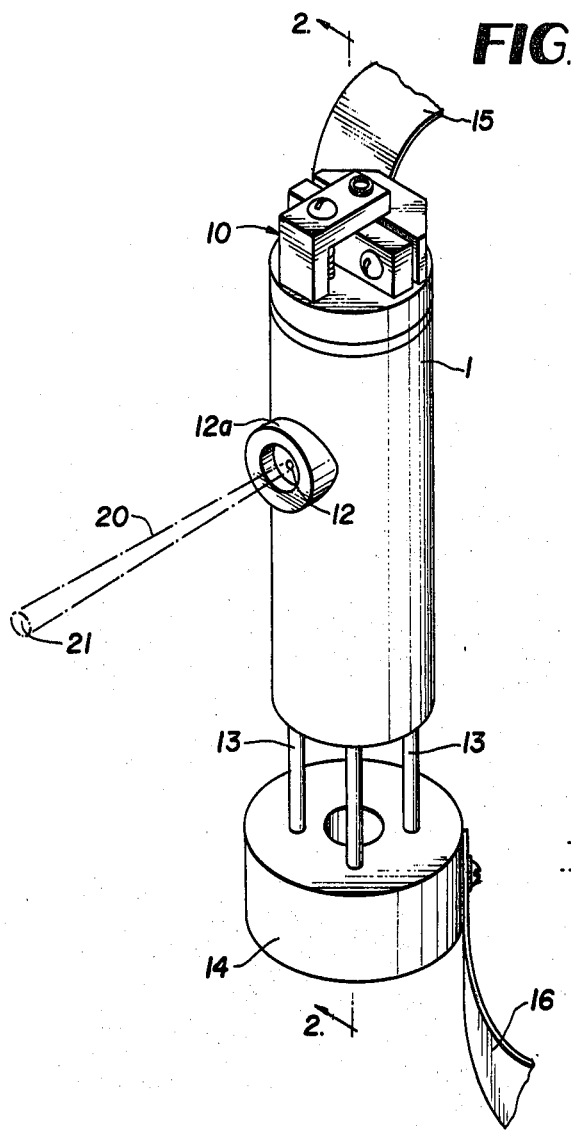
FIG. 1 is a perspective view of the nozzle beam source of the present invention.
Figure 2:
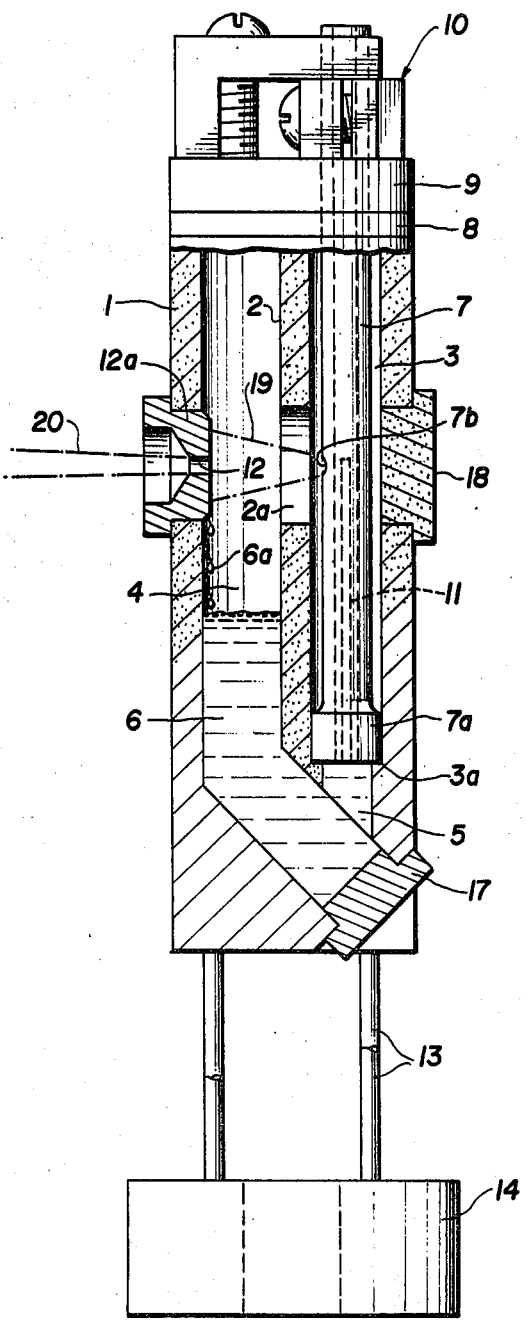
FIG. 2 is a view taken along line 2—2 of FIG. 1.

Referring to FIGS. 1 and 2 of the drawing, the nozzle beam source of the present invention comprises, a graphite cylindrical housing 1 having a longitudinally extending graphite partition 2 dividing the housing into a source chamber 3 and a collimation chamber 4 interconnected by an aperture 2a formed in the partition. The lower end of the partition 2 is spaced above the bottom wall of the housing to provide a flow passage 5 to the source chamber 3 for a supply of liquid gold 6 in the lower end of the collimation chamber 4 which forms a crucible. A longitudinally extending graphite source 7 is mounted in the source chamber 3 coaxially therewith, the lower end of the tube being enlarged as at 7a and seated on a shoulder 3a formed on the lower wall portion of the source chamber 3. The upper end portion of the source tube 7 extends through an insulator 8 and a header 9 provided on the top of the housing 1, the source tube 7 being held in fixed position by a suitable clamp assembly 10.

A tungsten wick 11 is mounted within the source tube 7 to provide a relatively large gold surface for vaporization, to be described more fully hereinafter.

A source aperture 7b is provided in the wall of the source tube 7, the aperture being aligned with a collimation aperture 12 formed in a nozzle 12a mounted in the wall of the housing 1.

To complete the structure of the nozzle beam source of the present invention, the housing 1 is provided with a plurality of legs 13 for supporting the housing on a suitable base 14, and electrical conductors 15 and 16 are electrically connected to the source tube 7 and housing 1 for heating the respective components, and the housing 1 is sealed by graphite plugs 17 and 18 mounted in the bottom and side walls of the housing 1.

The operation of the beam source of the present invention is similar to the beam source disclosed in the aforementioned Vig et al. patent in that the collimation chamber 4 containing the gold 6 is maintained at a temperature near the melting point of the gold thereby maintaining a relatively low vapor pressure, and the source tube 7 is maintained at a high temperature so as to maintain the vapor pressure of the gold at a high pressure. Because of the pressure differential between the collimation chamber 4 and the source tube 3, a vapor flow is established through the source aperture 7b. A portion of this flow passes through the collimation aperture 12, as shown in phantom in FIGS. 1 and 2, and plates the substrate (not shown). The largest fraction of the flow, however, strikes the wall of the nozzle 12a surrounding the aperture 12, condenses as at 6a, and is recycled to the source chamber 3 via the passage 5. This recycling can take place continuously by maintaining the collimation chamber 4 at slightly above the melting point of the gold evaporant, or intermittently, by maintaining the collimation chamber below the melting point of the gold and then raising the temperature to above the melting point periodically to recycle the gold evaporant. By this construction and arrangement, the major part of the gold evaporant flow not needed to plate the substrate is recycled and not wasted which is very significant when the evaporant is a precious metal, such as gold.

In use, it has been found that a source aperture 7b having a diameter of 0.020" resulted in a vapor flow having an approximately 24° conical spray 19 into the collimation chamber 4 which was trimmed to a 2½° conical spray 20 by the collimation aperture 12, resulting in a vapor deposit 21 of 0.327" diameter at 7.5" from the beam source.

As noted above, the housing 1 and partition 2 defining the source chamber 3 and collimation chamber 4, and the source tube 7, are made of graphite. Liquid gold does not wet or penetrate graphite surfaces so that between heating cycles when the gold 6 cools to room temperature, a gap or clearance is formed between the gold and the walls of the source tube 7, source chamber 3 and collimation chamber 4, whereby upon reheating the gold 6 to its melting point, the gold expands into the gap or clearance without exerting any force on the walls of the source tube, source chamber 3 and collimation chamber 4. The sealing plugs 17 and 18 are also made of graphite to prevent the gold from penetrating the plugs.

We claim:

1. Apparatus for generating a beam of metal vapor to plate a workpiece comprising a graphite housing having top, bottom and side walls, said bottom and side walls including graphite sealing plugs, a graphite partition connected to the housing top wall and extending longitudinally within the housing parallel to the side walls, said partition dividing the housing into a source chamber, and a collimation chamber, an aperture provided in said partition interconnecting said chambers, a supply of metal to be vaporized provided in said collimation chamber, said metal having the property of not wetting or penetrating graphite, the lower end of said partition being spaced from the bottom wall of the housing to provide a flow passage between the collimation chamber and the source chamber, a graphite source tube mounted in the source chamber, the upper end of said source tube extending through the top wall of said housing, the lower end of said tube communicating with said flow passage, a wick mounted within said source tube, the lower end of said wick communicating with said flow passage, a source aperture provided in the side wall of said source tube adjacent said partition aperture, the upper end of said wick extending adjacent said source aperture, a collimation aperture formed in the side wall of said housing communicating with said collimation chamber and aligned with said source aperture, means for heating said collimation chamber to maintain a temperature below the melting point of said metal and for periodically raising the temperature to the melting point of said metal, thereby maintaining a relatively low metal vapor pressure in said collimation chamber, and means for heating said source tube to a temperature sufficient to vaporize said metal and to maintain a high metal vapor pressure within said source tube, whereby the pressure differential between the collimation chamber and the source tube creates a vapor flow through said source aperture, a substantial portion of said flow striking the wall of the collimation chamber surrounding the collimation aperture and condensing the metal to liquid, the remaining portion of the flow passing through the collimation aperture to impinge upon said workpiece, said flow passage recirculating the liquid metal from the collimation chamber to said wick within said source tube, and including a clearance formed between said metal and said graphite walls and sealing plugs and graphite partition and source tube when said metal is in a cool state between heating cycles, said metal expanding into said clearance upon heating to the melting point without exerting force on said walls and plugs and partition and source tube.

2. Apparatus according to claim 1 wherein the wick is made of tungsten.

3. Apparatus according to claim 1 wherein said metal is gold.

* * * * *